(12) United States Patent
Russell et al.

(10) Patent No.: US 10,211,428 B2
(45) Date of Patent: Feb. 19, 2019

(54) METAL-BASED OPTICAL DEVICE ENABLING EFFICIENT LIGHT GENERATION FROM EMITTERS ON A HIGH-INDEX ABSORBING SUBSTRATE

(71) Applicant: President and Fellows of Harvard College, Cambridge, MA (US)

(72) Inventors: Kasey Joe Russell, Cambridge, MA (US); Tsung-Li Liu, Ashburn, VA (US); Evelyn L. Hu, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 30 days.

(21) Appl. No.: 15/314,635

(22) PCT Filed: Jun. 24, 2015

(86) PCT No.: PCT/US2015/037368
§ 371 (c)(1),
(2) Date: Nov. 29, 2016

(87) PCT Pub. No.: WO2015/200451
PCT Pub. Date: Dec. 30, 2015

(65) Prior Publication Data
US 2017/0104180 A1    Apr. 13, 2017

Related U.S. Application Data

(60) Provisional application No. 62/016,187, filed on Jun. 24, 2014.

(51) Int. Cl.
*H01L 51/52* (2006.01)
*H01L 51/00* (2006.01)
(Continued)

(52) U.S. Cl.
CPC ...... *H01L 51/5262* (2013.01); *H01L 51/0096* (2013.01); *H01L 51/5012* (2013.01);
(Continued)

(58) Field of Classification Search
CPC ............ H01L 51/5262; H01L 51/0096; H01L 51/5012; H01L 51/56
See application file for complete search history.

(56) References Cited

U.S. PATENT DOCUMENTS 6,037,190 A * 3/2000 Chao .................. H01L 27/3211
                                                         438/35
6,689,494 B1 * 2/2004 Karandikar ............ C09K 11/06
                                                         252/301.16
(Continued)

FOREIGN PATENT DOCUMENTS

WO     WO 2013/112498 A1    8/2013
WO     WO 2014/028380 A2    2/2014

OTHER PUBLICATIONS

International Search Report and Written Opinion dated Sep. 16, 2015 for Application No. PCT/US2015/037368.
(Continued)

*Primary Examiner* — Ida M Soward
(74) *Attorney, Agent, or Firm* — Wolf, Greenfield & Sacks, P.C.

(57) ABSTRACT

A light emitting device is described that may reduce the coupling of emitted light into silicon and may increase the efficiency with which light is emitted into the far field. Such a device may include a semiconductor layer, a metallic structure, and a light emission layer disposed between the semiconductor layer and the metallic structure. The light emission layer may be in physical contact with the metallic
(Continued)

structure and the semiconductor layer. The light emission layer may include at least one fluorescent molecule that emits light upon excitation.

12 Claims, 10 Drawing Sheets

(51) Int. Cl.
H01L 51/50 (2006.01)
H01L 51/56 (2006.01)

(52) U.S. Cl.
CPC .............. *H01L 51/52* (2013.01); *H01L 51/56* (2013.01); *H01L 51/5271* (2013.01); *H01L 2251/558* (2013.01)

(56) References Cited

U.S. PATENT DOCUMENTS

| | | | |
|---|---|---|---|
| 7,208,768 B2 | 4/2007 | Ono et al. | |
| 7,259,055 B2 | 8/2007 | Li et al. | |
| 7,528,542 B2* | 5/2009 | Kawamura | H01L 51/002 313/504 |
| 7,906,224 B2* | 3/2011 | Taka | C09K 11/06 252/301.32 |
| 8,129,896 B2* | 3/2012 | Jeong | C09K 11/025 313/503 |
| 8,723,208 B2* | 5/2014 | Ikemoto | H01L 33/10 257/100 |
| 9,335,539 B2 | 5/2016 | Shian et al. | |
| 2002/0047551 A1 | 4/2002 | Rubner et al. | |
| 2003/0111666 A1* | 6/2003 | Nishi | H01L 51/0051 257/79 |
| 2005/0285128 A1* | 12/2005 | Scherer | H01L 33/22 257/98 |
| 2006/0115917 A1 | 6/2006 | Linden | |
| 2007/0223940 A1 | 9/2007 | Smolyaninov et al. | |
| 2008/0006817 A1 | 1/2008 | Kawaguchi | |
| 2008/0142782 A1 | 6/2008 | Moon et al. | |
| 2008/0260970 A1* | 10/2008 | Nakayama | H01L 51/002 428/1.1 |
| 2014/0001450 A1* | 1/2014 | Shinotsuka | H01L 51/5225 257/40 |
| 2015/0214261 A1 | 7/2015 | Park et al. | |
| 2016/0028041 A1* | 1/2016 | Naganawa | H01L 51/448 257/40 |
| 2017/0005235 A1* | 1/2017 | Chou | H01L 33/38 |

OTHER PUBLICATIONS

International Preliminary Report on Patentability dated Jan. 5, 2017 for Application No. PCT/US2015/037368.
Alam et al., Super Mode Propagation in Low Index Medium. Conference on Lasers and Electro-Optics. Baltimore, MD. May 6, 2007. Paper JThD112. 2 pages.
Avrutsky et al., Sub-wavelength plasmonic modes in a conductor-gap-dielectric system with a nanoscale gap. Opt Express. Jan. 4, 2010;18(1):348-63.
Chance et al., Molecular Fluorescence and Energy Transfer Near Interfaces. Adv Chem Phys. 1978;37(7):1-65.
Chen et al., Metallodielectric Hybrid Antennas for Ultrastrong Enhancement of Spontaneous Emission. Phys Rev Lett. Jun. 8, 2012;108:233001.1-5.
Green et al., Efficient silicon light-emitting diodes. Nature. Aug. 23, 2001;412:805-8.
Hryciw et al., Plasmon-enhanced emission from optically-doped MOS light sources. Opt Express. Jan. 5, 2009;17(1):185-92.
Huh et al., Enhancement in Light Emission Efficiency of a Silicon Nanocrystal Light-Emitting Diode by Multiple-Luminescent Structures. Adv Mater. 2010;22:5058-62.
Ma et al., Room-temperature sub-diffraction-limited plasmon laser by total internal reflection. Nat Mater. Dec. 19, 2010;10:110-3.
Oulton et al., A hybrid plasmonic waveguide for subwavelength confinement and long-range propagation. Nat Photon. Aug. 2008;2:496-500.
Oulton et al., Plasmon lasers at deep subwavelength scale. Nature. 2009;461:629-32.
Saito et al., Silicon light-emitting transistor for on-chip optical interconnection. Appl Phys Lett. 2006;89:163504.1-3.
Saito et al., Stimulated emission of near-infrared radiation in silicon fin light-emitting diode. Appl Phys Lett. 2011;98:261104.1-3.
Saito et al., Electro-Luminescence from Ultra-Thin Silicon. Japanese J Appl Phys. 2006;45(27):L679-82.
Sorger et al., Strongly Enhanced Molecular Fluorescence inside a Nanoscale Waveguide Gap. Nano Lett. 2011;11:4907-11.

* cited by examiner

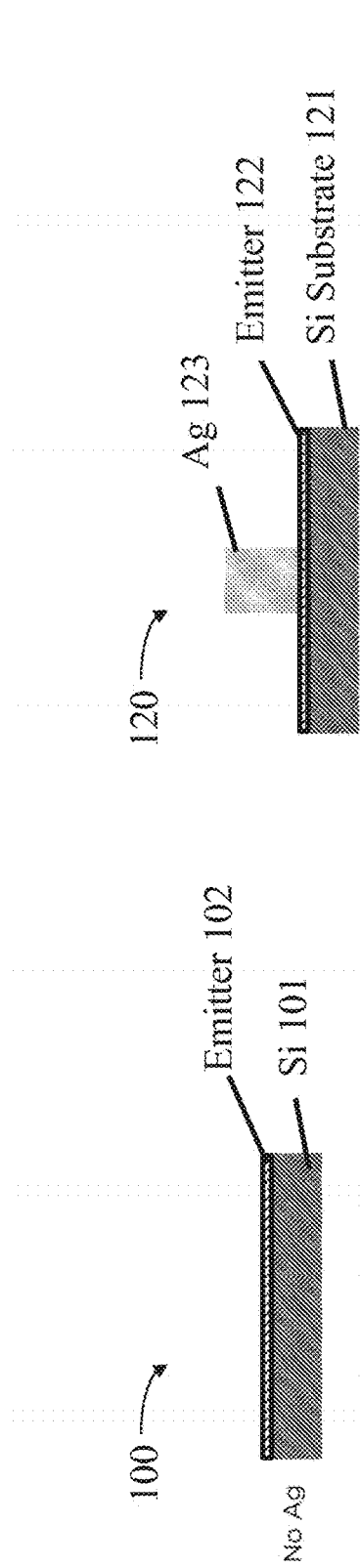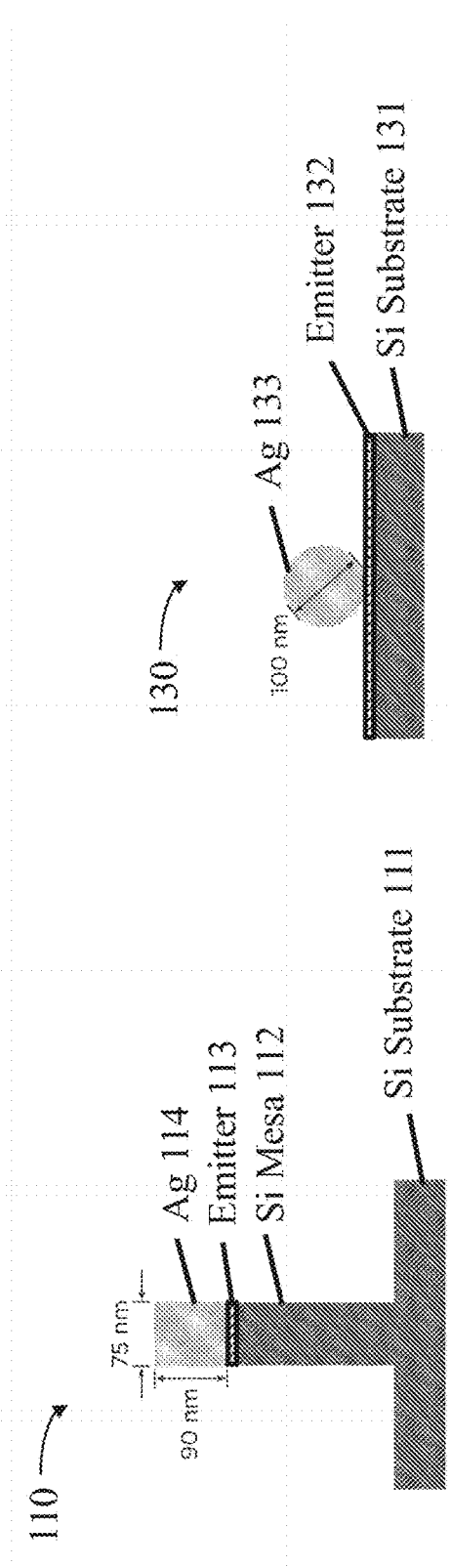

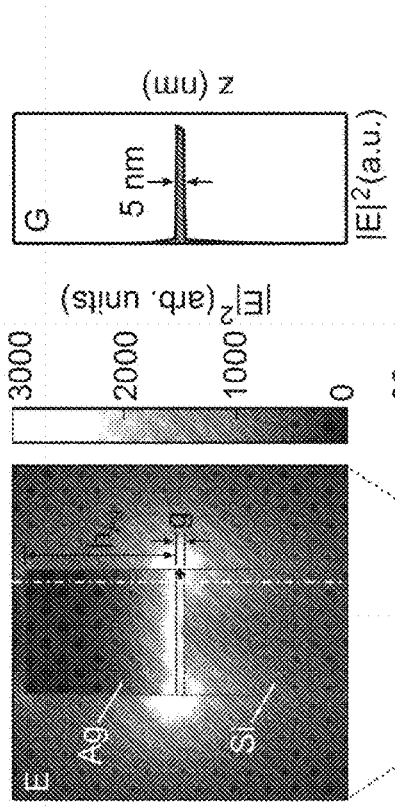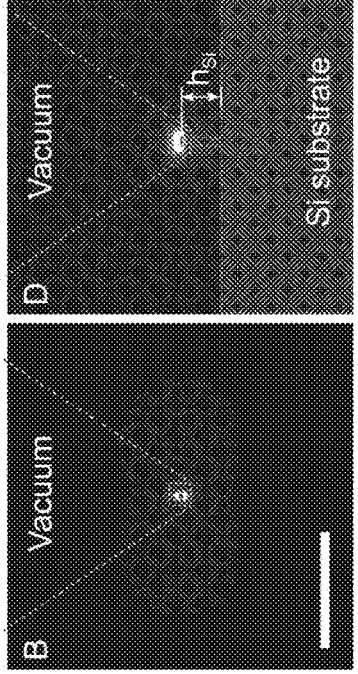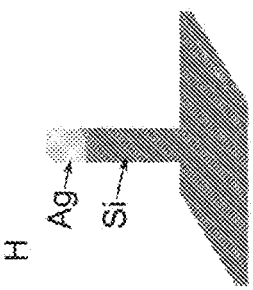

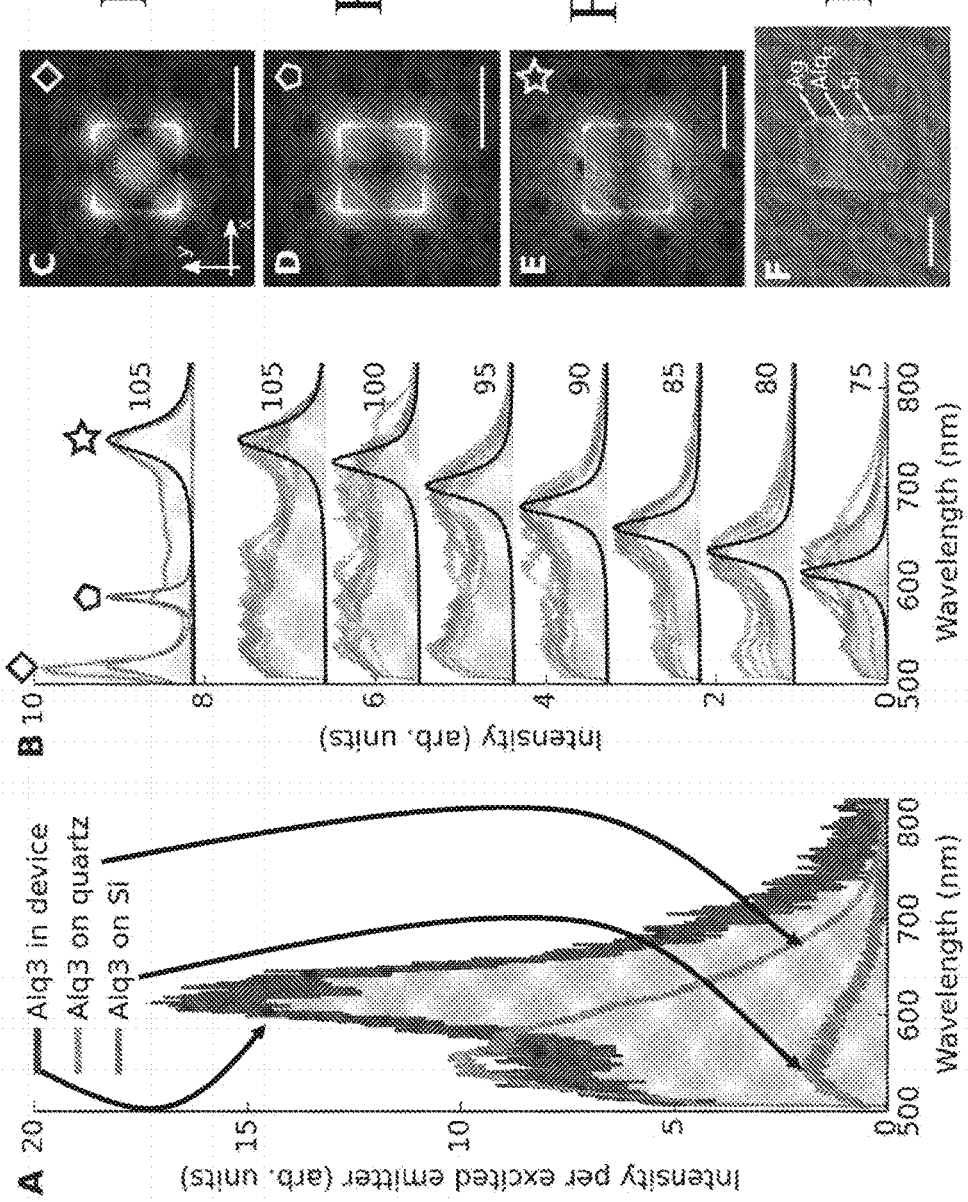

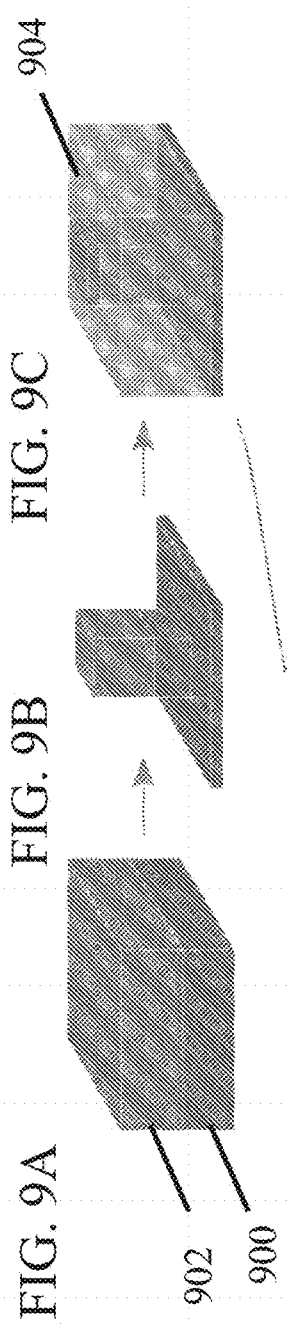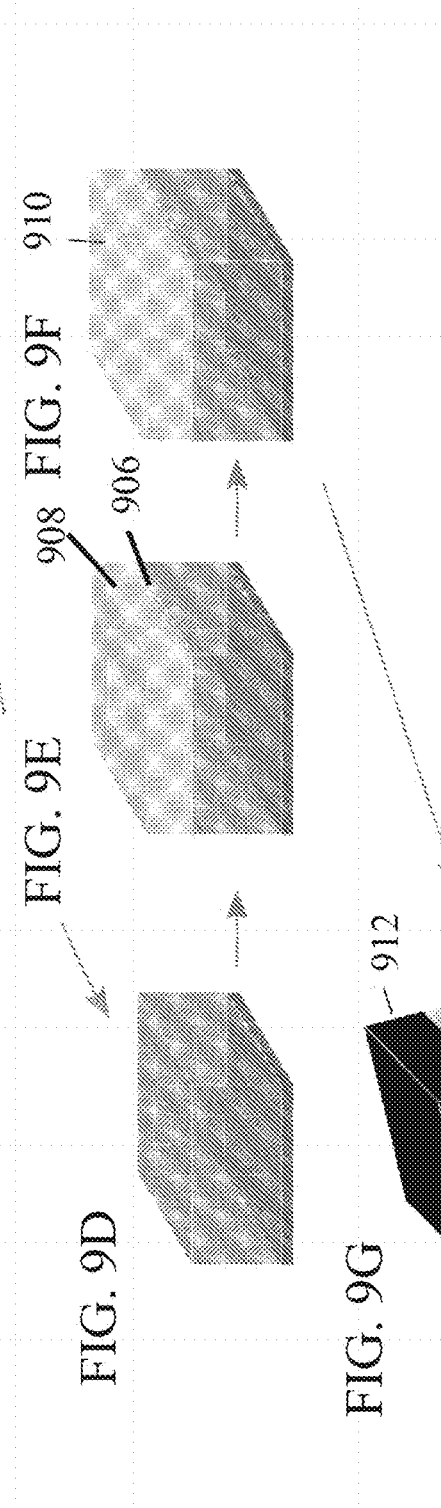

METAL-BASED OPTICAL DEVICE ENABLING EFFICIENT LIGHT GENERATION FROM EMITTERS ON A HIGH-INDEX ABSORBING SUBSTRATE

CROSS-REFERENCE TO RELATED APPLICATIONS

The present application is a national stage filing under 35 U.S.C. 371 of International Patent Application Ser. No. PCT/US2015/037368, filed Jun. 24, 2015, entitled "METAL-BASED OPTICAL DEVICE ENABLING EFFICIENT LIGHT GENERATION FROM EMITTERS ON A HIGH-INDEX ABSORBING SUBSTRATE", which claims the benefit under 25 U.S.C. § 119(e) of U.S. Provisional Application Ser. No. 62/016,187 filed on Jun. 24, 2014, titled, "METAL-BASED OPTICAL DEVICE ENABLING EFFICIENT LIGHT GENERATION FROM EMITTERS ON A HIGH-INDEX ABSORBING SUBSTRATE," each of which is hereby incorporated by reference in its entirety.

BACKGROUND

Embodiments of this application relate generally to light emitting devices and more specifically to emitting light in from an emitter confined between a semiconductor layer and a metallic structure.

Entire classes of materials are currently unsuitable for use as substrates in visible light emitting devices (LEDs) due to their optical properties. For LEDs operating at visible frequencies, silicon (Si), is an example of an unsuitable substrate. If LEDs could be formed directly on silicon, it would provide an interface between electronic signal processing in silicon and optical signal generation for data transmission or visualization. An advantage of using light at visible frequencies is that two common detectors, the human eye and silicon diodes, are highly-sensitive in this frequency regime.

Silicon, however, has a high index of refraction and is absorbing to light at visible frequencies. Thus, conventional LEDs on silicon are optically isolated from the bulk silicon substrate to prevent the emitted light from being guided into the silicon, where it would then be trapped and absorbed. In practice, this optical isolation typically requires the LED to be fabricated separately and then bonded or soldered onto the silicon.

Similar concerns restrict the development of LEDs on many high-index, absorbing materials in various frequency ranges in the visible and near-infrared, such as gallium phosphide, aluminum phosphide, aluminum arsenide, boron phosphide, boron arsenide, and germanium.

SUMMARY

The inventors have recognized and appreciated that integrating high-performance electronic and optical circuits within the same platform would be advantageous to many industrial application. Such an approach could make possible cost-effective, high speed computation and communications at a broad set of frequencies and with lower power dissipation. However, there are key differences in the attributes of materials best-suited for electronic applications and those which are optimal for optical applications. The challenges of integrating the different materials on a common platform (for example, achieving highly efficient optical sources within a materials platform optimized for electronic performance) relate to design complexity, performance trade-offs and increased cost.

The inventors have recognized and appreciated the above challenges of forming LEDs directly on high-index, absorbing materials. Silicon is used throughout this application as an example of a high-index, absorbing material, but embodiments are not limited to any particular material. Forming LEDs directly on silicon is challenging for at least two reasons. First, bulk silicon absorbs light at all visible frequencies. Second, silicon has a very large relative dielectric permittivity (the real part of the relative dielectric permittivity, $Re(\varepsilon_{Si})$, is approximately 16.0 at visible frequencies), resulting in light being guided into the absorbing silicon from any adjacent material rather than being emitted into free-space. It is because of these two reasons that conventional LEDs on silicon are optically isolated from the bulk silicon substrate to prevent optical loss in the silicon.

The inventors have also recognized and appreciated that the conventional approach of fabricating the LED separately from the silicon and joining the two after the fact can be expensive and challenging to implement. Moreover, the inventors have also recognized and appreciated it is difficult to place the fabricated LED onto the silicon substrate with the requisite nanometer precision used in silicon electronics.

For at least these reasons, the inventors have developed a light emitting device that reduces the coupling of emitted light into silicon and increases the efficiency with which light is emitted into the far field. The inventors have recognized and appreciated that confining an emitter between silicon and a metal structure can plasmonically enhance the rate with which light is emitted from the device.

Accordingly, some embodiments of the present application are directed to a light emitting device comprising a semiconductor layer, a metallic structure, and a light emission layer disposed between the semiconductor layer and the metallic structure, wherein the light emission layer is in physical contact with the metallic structure and the semiconductor layer, wherein the light emission layer comprises at least one fluorescent molecule that emits light of at least a first frequency upon excitation by an excitation signal.

In some embodiments, the semiconductor layer comprises a semiconductor material with a relative permittivity greater than or equal to 10 at the first frequency, such as silicon, gallium phosphide, aluminum phosphide, aluminum arsenide, boron phosphide, boron arsenide, or germanium. The metallic structure may be a metallic layer that completely covers one surface of the light emission layer. A thickness of the light emission layer may be less than a thickness of the metallic layer. In some embodiments, the thickness of the light emission layer is at least an order of magnitude smaller than the thickness of the metallic layer. In other embodiments, the metallic structure is a metallic sphere that is in contact with the light emission layer at a single location.

In some embodiments, the semiconductor layer comprises a semiconductor substrate. In other embodiments, the semiconductor layer comprises a semiconductor mesa that extends from a semiconductor substrate. A width of the semiconductor mesa may be equal to a width of the metallic structure. In some embodiments, the width of the semiconductor mesa is less than 200 nm, such as, for example, 50 nm.

Some embodiments are directed to a method of emitting light, the method comprising acts of exciting at least one fluorescent molecule confined between a semiconductor layer and a metallic structure; emitting light, from the at least one fluorescent molecule, into free space; and collecting the emitted light with an external quantum efficiency that is greater than 3%. In some embodiments, the at least one fluorescent molecule is confined in a nanoscale gap between a semiconductor layer and a metallic structure.

Some embodiments are directed to a method of manufacturing a light emitting device, the method comprising acts of forming a semiconductor layer; forming a light emission layer in physical contact with the semiconductor layer; and forming a metallic structure in physical contact with the light emission layer, wherein the light emission layer comprises at least one fluorescent molecule that emits light of at least a first frequency upon excitation by an excitation signal.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1A illustrates a cross-sectional view of a conventional light emitting device;

FIG. 1B illustrates a cross-sectional view of a light emitting device including a silicon mesa according to some embodiments;

FIG. 1C illustrates a cross-sectional view of a light emitting device including a light emitting layer on a silicon substrate according to some embodiments;

FIG. 1D illustrates a cross-sectional view of a light emitting device including a metallic sphere according to some embodiments;

FIG. 5A illustrates the electric field amplitude emitted from an emitter in a dielectric layer without a semiconductor layer or a metallic structure;

FIG. 5B illustrates the electric field amplitude emitted from an emitter in a dielectric layer without a semiconductor layer or a metallic structure;

FIG. 5C illustrates the electric field amplitude emitted from an emitter in a dielectric layer on a silicon mesa without a metallic structure;

FIG. 5D illustrates the electric field amplitude emitted from an emitter in a dielectric layer on a silicon mesa without a metallic structure;

FIG. 5E illustrates the electric field amplitude emitted from an emitter in a dielectric layer on a silicon mesa with a metallic structure;

FIG. 5F illustrates the electric field amplitude emitted from an emitter in a dielectric layer on a silicon mesa with a metallic structure;

FIG. 5G illustrates the electric field intensity versus z along the broken line shown in FIG. 5E;

FIG. 5H is a three-dimensional illustration of a light emitting device according to some embodiments;

FIG. 6A illustrates photoluminescence spectra from a 5 nm thick film of Alq3 under three different conditions;

FIG. 6B illustrates emission intensity under different symmetry conditions and for different mesa widths;

FIG. 6C illustrates the field mode given even x-axis and y-axis symmetry;

FIG. 6D illustrates the field mode given odd x-axis and y-axis symmetry;

FIG. 6E illustrates the field mode given even x-axis and odd y-axis symmetry;

FIG. 6F is a scanning electron micrograph of a light emitting device according to some embodiments;

FIG. 9A the structure of the light emitting device during a fabrication method according to some embodiments;

FIG. 9B the structure of the light emitting device during a fabrication method according to some embodiments;

FIG. 9C the structure of the light emitting device during a fabrication method according to some embodiments;

FIG. 9D the structure of the light emitting device during a fabrication method according to some embodiments;

FIG. 9E the structure of the light emitting device during a fabrication method according to some embodiments;

FIG. 9F the structure of the light emitting device during a fabrication method according to some embodiments;

FIG. 9G the structure of the light emitting device during a fabrication method according to some embodiments;

FIG. 9H the structure of the light emitting device during a fabrication method according to some embodiments;

FIG. 9I the structure of the light emitting device after a fabrication method according to some embodiments.

DETAILED DESCRIPTION

Figure 2:
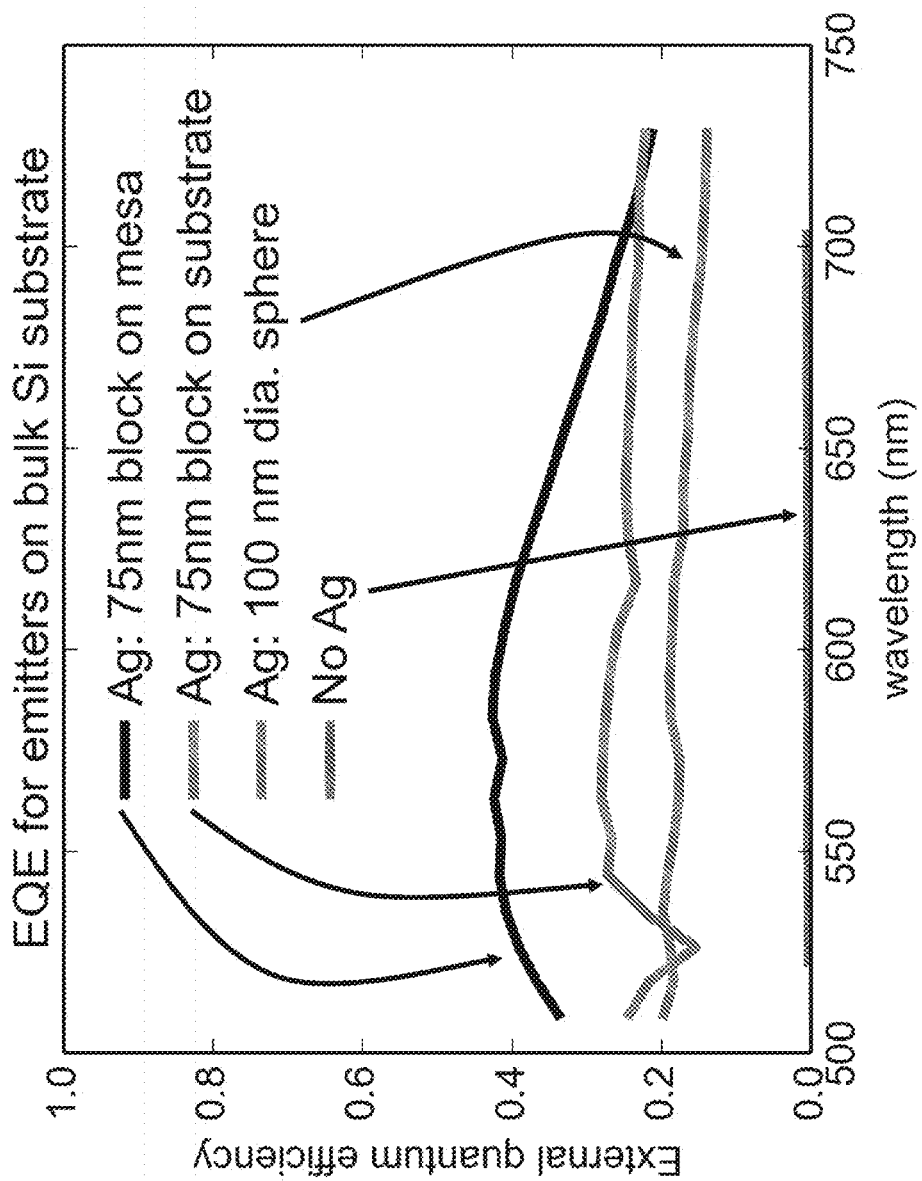
FIG. 2 illustrates the external quantum efficiency of the devices illustrated in FIG. 1A-D.

As mentioned in the above summary, the inventors have developed a light emitting device that reduces the coupling of emitted light into silicon or other, well-chosen semiconductors which are not themselves efficient light emitters, and increases the efficiency with which light is emitted into the far field. The inventors have recognized and appreciated that, with the appropriate choice of semiconductor, emitter and metal structure, confining an emitter between silicon and a metal structure can plasmonically enhance the rate with which light is emitted from the device. Embodiments utilize conductor-gap-dielectric plasmonic modes to confine light in a nanoscale gap between bulk silicon and a metal structure. The confinement both reduces the fraction of light absorbed by the silicon substrate and enhances spontaneous emission by the emitter, thereby enabling bright, efficient light emission from nanometer-scale devices fabricated directly on silicon.

The nanoscale gap structure inverts the conventional paradigm in which high-permittivity, absorbing substrates lead to more loss. Thus, the structure of some embodiments leads to unexpected results contrary to what one of skill in the art would have expected. The inventors have appreciated and recognized that although silicon itself is absorbing, it has such a high permittivity that it nevertheless can outperform conventional, non-absorbing materials such as GaN or silicon dioxide. Consequently, not only is it possible to fabricate high-brightness visible-frequency optical sources on silicon, but, from a brightness and efficiency standpoint, at certain frequencies, silicon is a more suitable substrate for these devices than other materials. Embodiments described in the present application are important both within the context of silicon opto-electronics and more broadly within the emerging field of metal-based optics. In particular, some embodiments underscore the ability to use the strong field confinement capabilities of plasmonics to provide new approaches to solving long-standing technological challenges in optics and photonics.

While some embodiments described in the present are described as using a silicon substrate, any suitable semiconductor material may be used. For example, any material with a relatively large dielectric permittivity may be used. However, silicon is a good choice of material due to its prevalence in the optical and electronic devices.

FIG. 1A illustrates a conventional light emitting device 100. The device 100 includes a light emission layer on top of a bulk silicon substrate 101. No metal layer is present in device 100.

FIG. 1B illustrates a light emitting device 110 according to one embodiment. A silicon substrate 111 forms a bottom layer of the device 110. At one or more locations on the silicon substrate 111, silicon mesas 112 are formed. While only a single silicon mesa 112 is illustrated in FIG. 1B, any suitable number of silicon mesas may be formed on the substrate 111. Moreover, the silicon mesas 112 may be formed in any suitable shape or pattern. For example, a plurality of mesas may form a geometrical shape, such as a circle, rectangle, square or any other shape. In other embodiments, the silicon mesas 112 may be formed in an array with a certain periodicity.

The silicon mesa 112 may be any suitable shape. For example, when viewed from above, the mesa 112 may be circular, rectangular, square or any other suitable polygonal shape. Moreover, the mesa 112 may be any suitable size. For example, the mesa 112 may have a diameter of less than 200 nm. The example mesa 112 shown in FIG. 1B has a diameter of 75 nm. Other embodiments may have a diameter of 50 nm. In some embodiments, reducing the diameter of mesa 112 may increase the efficiency with which light is emitted into the far field above the substrate (referred to as the "external quantum efficiency"). For example, in one embodiment with a mesa with a diameter of 175 nm, the external quantum efficiency was less than 20%, whereas a second embodiment with a mesa with a diameter of 50 nm, the external quantum efficiency was approximately 30%.

In device 110, light emission layer 113 is formed on top of each silicon mesa 112. The bottom surface of the emitter 113 is in physical contact with a top surface of the silicon mesa 112. The light emission layer 113 has the same size and shape as the silicon mesa 112. The light emission layer 113 has a thickness that is less than the thickness of the silicon mesa 112 and less than the thickness of the metallic layer 114, described below. In some embodiments, the light emission layer 113 is less than the wavelength of light emitted by the light emission layer. For example, the light emission layer 113 may be approximately 5 nm thick.

The light emission layer 113 may be formed from any suitable low-permittivity material so as to create a low-permittivity gap between the silicon mesa 112 and the metallic layer 114. For example, the light emission layer 113 may comprise silicon dioxide. One or more light emitters (not shown) are embedded in the light emission layer 113. For example, the light emitters may include one or more fluorophores. Any suitable fluorophore may be used. For example, $Alq_3$ may be used in some embodiments.

A metallic structure 114 is formed on top of light emission layer 113. In the embodiment illustrated in FIG. 1B, the metallic structure 114 is a metallic layer with a bottom surface that is in physical contact with a top surface of the light emission layer 113. The metallic layer 114 of device 110 has a thickness greater than the thickness of the emitter 113, but less thick than the thickness of the silicon mesa 112. For example, the metallic layer of FIG. 1B has a thickness of 90 nanometers. It should be noted that the metallic structure 114 is not limited to be a metallic layer. In some embodiments, the metallic structure 114 may be any suitable shape. For example, the metallic structure 114 may be a metal sphere.

The metallic structure 114 may be formed from any suitable metallic material. In some embodiments, the metallic structure 114 is formed from a single metallic element, such as silver. In other embodiments, the metallic structure 114 may be formed from a metal alloy that is a combination of multiple metallic elements. In other embodiments, the metallic structure may comprise a material that has metallic properties. For example, the metallic material may be a heavily-doped semiconductor or a dielectric such as titanium nitride.

FIG. 1C illustrates a light emitting device 120 according to another embodiment. Unlike the embodiment illustrated in FIG. 1B, there is no silicon mesa in device 120. Instead, the light emitting layer 122 is in physical contact with the silicon substrate 121. The light emitting layer 122 is illustrated as covering the entire silicon substrate 121, but embodiments are not so limited. For example, the light emitting layer 122 may cover only a portion of the silicon substrate 121. In some embodiments, the light emitting layer 122 may only cover a portion of the silicon substrate 121 that is under the metallic structure 123.

The metallic structure 123 of device 120 is illustrated as being a metallic layer that covers only a portion of the light emitting layer 122, with the bottom surface of the metallic layer in physical contact with the light emitting layer 122. However, embodiments are not so limited. The metallic structure 123 may take any suitable size and shape. For example, FIG. 1D illustrates an embodiment where the metallic structure 133 is a sphere of silver with a diameter of 100 nanometers. In the light emitting device 130 of FIG. 1D, the metallic structure 133 is only in contact with the light emitting layer 132 at a single point.

In the embodiments illustrated in FIG. 1B-D, the light emitting layer comprises light emitters embedded in the low-permittivity dielectric. At least a portion of the light emitting layer is confined between a metallic structure and a semiconductor layer, such as a silicon mesa or a silicon substrate. As a result of this structure, there is coherent coupling between the conduction electrons in the metallic structure and bound electrons in the semiconductor layer. The structure also results in strong confinement of the optical field within the gap and a very large increase in the electric field intensity radiated from the light emitters.

FIG. 2 illustrates the external quantum efficiencies versus wavelength for the different embodiments illustrated in FIG. 1. "External quantum efficiency" refers to the power emitted into the far-field above the substrate. A conventional device 100, as illustrated in FIG. 1A, has practically zero external quantum efficiency across the emission spectrum. The device 130 illustrated in FIG. 1D has an improved external quantum efficiency that is between 15% and 20%. The device 120 illustrated in FIG. 1C has an improved external quantum efficiency that is between 15% and 30%. The device 110 illustrated in FIG. 1B has an improved external quantum efficiency that is between 20% and 45%. Accordingly, different shaped metallic structures result in different amounts of light being emitted to the far-field at different wavelengths. In some embodiments, the shape of the metallic structure may be tailored to maximize the external quantum efficiency at a particular wavelength. In some embodiments, a metallic structure with abrupt changes in effective index, e.g., sharp edges to the metallic structure, result in higher external quantum efficiencies.

Figure 3:
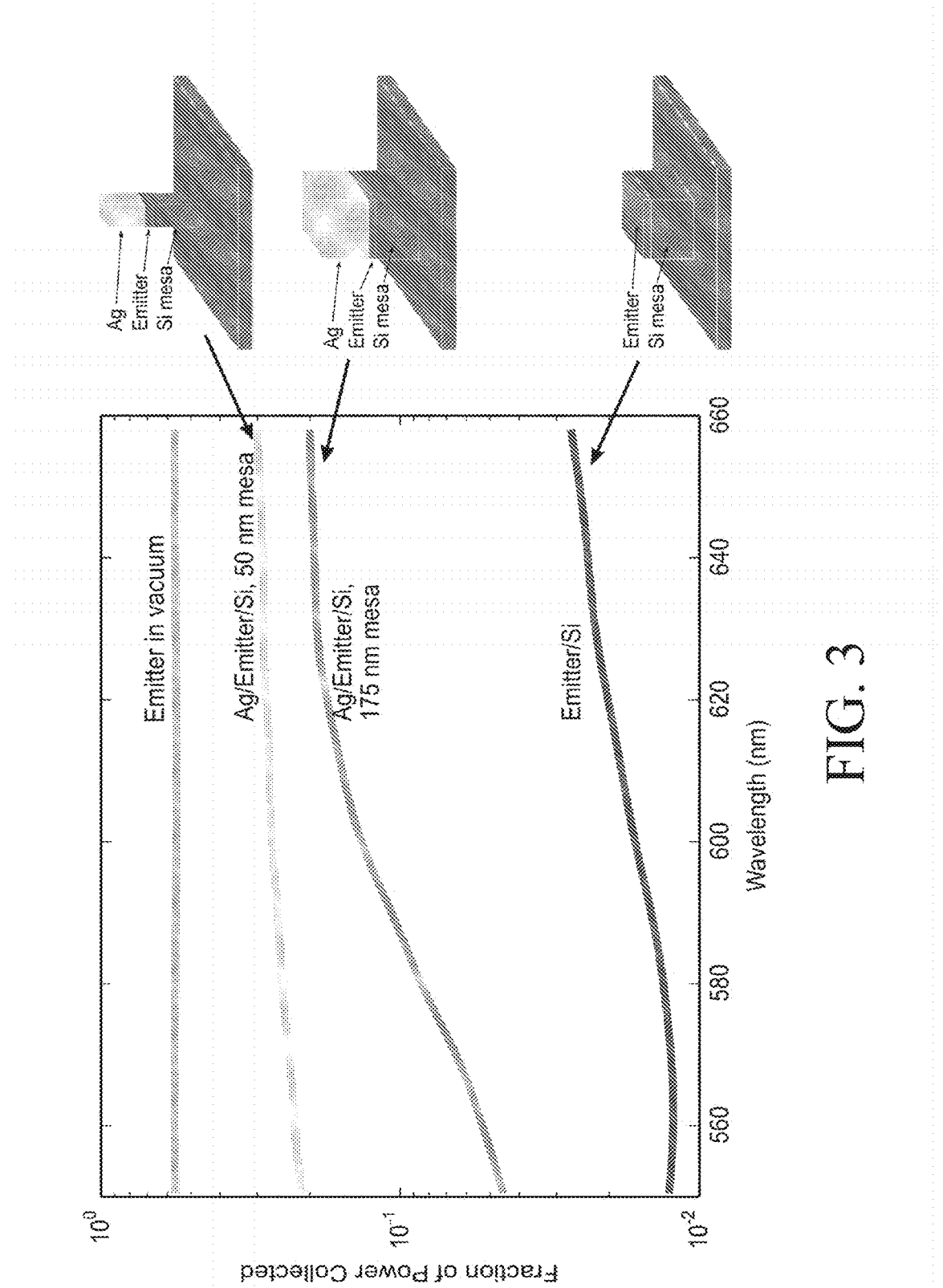
FIG. 3 illustrates the light power collected for various embodiments.
Figure 4:
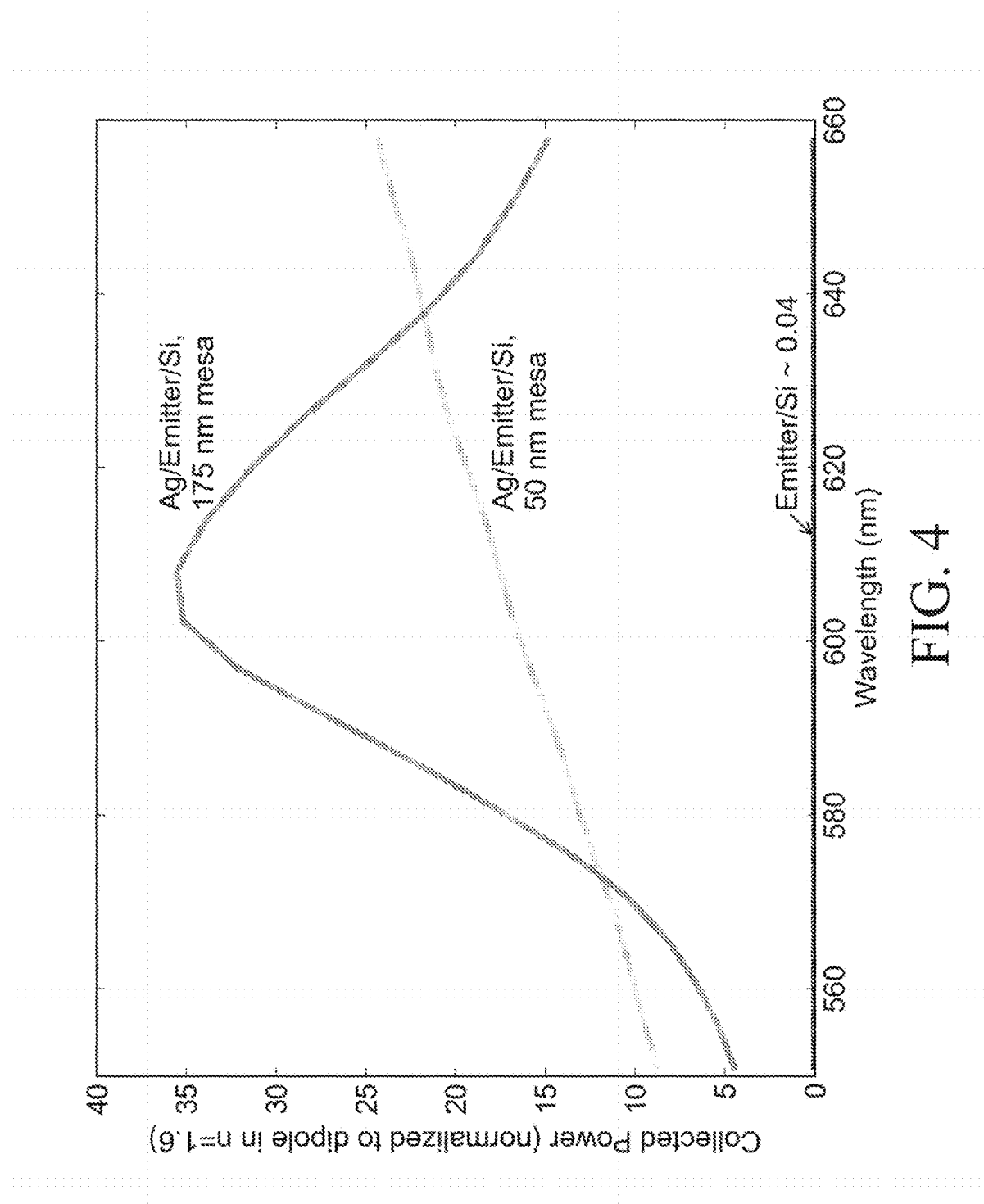
FIG. 4 illustrates the light power collected for various embodiments.

Although the external quantum efficiencies of some embodiments may be limited by absorption in both the metallic structure and the semiconductor layer and extraction efficiency, the power emitted may be enhanced relative to an isolated emitter or a device without a metallic structure, as illustrated in FIG. 2. The power collected may be further enhanced by tailoring the dimensions of the light emitting device to maximize external quantum efficiency. FIG. 3 illustrates the fraction of power collected in the positive z direction from a dipole oriented parallel to the z-axis under different conditions. In FIG. 3, the three devices involving a silicon mesa have an emitter embedded within a 10 nm thick layer of lossless dielectric of index n=1.6. The highest efficiency condition (~50%) is obtained from an isolated emitter. The lowest efficiency condition (~2%) is obtained from an emitter located 5 nm above the center of a square silicon mesa of width 175 nm and height 150 nm with no metallic structure. With the addition of a 100 nm thick layer of silver above the emitter, the efficiency increases nearly one order of magnitude. The efficiency may be further increased by reducing the lateral dimensions of the device to 50 nm, thereby reducing the amount of power coupled into the Si substrate. FIG. 4 illustrates the collected power in the positive-z direction for the geometries shown in FIG. 3 normalized to the power radiated by a dipole in bulk dielectric of index n=1.6. Numbers greater than 1 correspond with enhancement of spontaneous emission The increased intensity radiated from the light emitters in embodiments of the present application can be observed in FIGS. 5A-H where the electric field amplitude radiated by an electric-dipole optical emitter oriented parallel to the z-axis oscillating at 500 THz (corresponding to 600 nm wavelength in vacuum) under different conditions. FIG. 5A-B illustrate the electric field amplitude emitted from an emitter in a dielectric layer of index n=1.7, thickness g=5 nm, and length and width $w_X$=75 nm. The location of the emitter is represented by a cross. In this condition, there is no silicon layer and no metallic layer—only an emitter in a dielectric layer. FIG. 5A illustrates the emission amplitude at a smaller spatial scale than FIG. 2B (the bar in the lower left corner of FIG. 5B represents 1 micrometer). The amplitude scale of FIG. 5A is also different from that of FIG. 5B in order to enhance the far-field contrast.

FIGS. 5C-D illustrate the electric field amplitude that results when the same dielectric layer and emitter as shown in FIG. 5A-B is formed on top of a silicon mesa with a height/thickness of 350 nm. FIG. 5C-D also does not include a metallic structure. Relative to the center of the dielectric layer, the dipole emitter is located at x=30 nm, y=0 nm, z=0 nm. FIG. 5C illustrates the emission amplitude at a smaller spatial scale than FIG. 5D. The amplitude scale of FIG. 5C is also different from that of FIG. 5D in order to enhance the far-field contrast.

FIG. 5E-F illustrate the electric field amplitude that results when the same dielectric layer, emitter and silicon mesa and substrate as shown in FIG. 5C-D includes a metallic structure in the form of a silver layer with a height/thickness 90 nm on top of the dielectric layer, similar to the embodiment shown in FIG. 1B, a three-dimensional representation of which is illustrated in FIG. 5H. FIG. 5C-D also does not include a metallic structure. The spacing between the lower surface of the silver layer and the upper surface of the silicon mesa is determined by the thickness of the dielectric layer (g=5 nm). FIG. 5E illustrates the emission amplitude at a smaller spatial scale than FIG. 5F. The amplitude scale of FIG. 5E is also different from that of FIG. 5F in order to enhance the far-field contrast.

As can be seen by comparing the three electric field amplitudes of FIGS. 5A-B and FIGS. 5C-D, the silicon mesa alone does not have a large effect on the intensity of the radiated electric field. However, as is described below, the silicon mesa does absorb a large percentage of the emitted power, resulting in low external quantum efficiency. The electric field amplitude of FIGS. 5E-F, on the other hand, show that the addition of the metallic structure above the light emission layer yields an orders-of-magnitude increase in the electric field intensity and greater external quantum efficiency. FIG. 5G illustrates the electric field intensity versus z along the broken line shown in FIG. 5E.

Embodiments of the present application, which includes a conductor-gap-dielectric structure, provide the strong confinement which serves at least two purposes. First, by confining radiated energy within the low-loss gap layer (the light emission layer), the fraction of power that is coupled into and absorbed by the silicon mesa is substantially reduced, thereby increasing the external quantum efficiency (e.g., compare FIG. 5D to FIG. 5F). Second, the confinement greatly enhances the electric field at the location of the dipole, resulting in a large enhancement of spontaneous emission rate and radiated power.

As the dipole radiates, its energy couples to quasi-bound gap-plasmon states. In some embodiments, these states may be fully bound within the gap by reducing the thickness of the silicon mesa layer. In some embodiments, the width of the mesa ($w_X$, $w_Y$) is kept small to scatter the excitations into free-space propagating states. As the mesa width increases, the amount of energy absorbed by the silicon increases. Consequently, decreasing the mesa width increases the external quantum efficiency because the excitations more rapidly reach the edge of the mesa where they can scatter out of the gap into the far-field. Accordingly, in some embodiments, the mesa width is less than 200 nm. In some embodiments, the width of the mesa is 50 nm.

Excitations may also be partially reflected within the gap, forming a Fabry-Perot-like resonator that has standing wave patterns of frequency-dependent order and symmetry (See FIG. 6B-E). FIG. 6A illustrates photoluminescence spectra from a 5 nm thick film of Alq3 under three different conditions: in a light emitting device according to some embodiments, where the light emitting layer comprising the Alq3 is confined between a silicon mesa and a silver layer (a scanning electron micrograph of such an embodiment is illustrated in FIG. 6F (the scale bar represents 200 nm)); on a quartz substrate; and on a silicon substrate. Intensity was normalized to the number of excited emitters by dividing by the simulated absorption of the pump laser. A pulsed, frequency-doubled Ti:sapphire laser (Coherent) operating at ~455 nm was used as the excitation source. Typical power levels were ~1 micro Watt. Collected luminescence was coupled into a multimode fiber, dispersed with a grating spectrometer, and detected with a liquid nitrogen-cooled Si CCD array.

The top graph of FIG. 6B illustrates a simulated emission intensity under different symmetry conditions: no symmetry (filled curve); even x-axis and y-axis symmetry (diamond marker, corresponding to the mode shown in FIG. 6C); odd x-axis and y-axis symmetry (pentagon marker, corresponding to the mode shown in FIG. 6D); and even x-axis and odd y-axis symmetry (star marker, corresponding to the mode shown in FIG. 6E). The bottom graphs of FIG. 6B illustrate experimental photoluminescence spectra (gray) and simulated emission intensity with even x-axis symmetry and odd y-axis symmetry (black) for varying mesa widths, as indicated in nanometers on each graph (from top to bottom, the mesa widths ($w_X=w_Y$) illustrated are 105 nm, 100 nm, 95 nm, 90 nm, 85 nm, 80 nm, and 75 nm). The devices illustrated have light emission layer thickness g=5 nm, t silver layer thickness of 90 nm, and a silicon mesa thickness of 350 nm. As mentioned above, FIG. 6C-E are simulated field patterns in the x-y plane in the center of the gap for resonant modes of symmetry and wavelength indicated with the respective symbol in the top line of FIG. 6B. The scale bar represents 100 nm.

In some embodiments, additional spectral dependence results from the thickness of the silver layer, which acts as an antenna element. The above effects combine to produce the broad peaks that can be seen in simulations of emitted power (see FIG. 5) and in experimental spectra (See FIG. 6).

The radiation rate into gap-plasmon states increases for thinner gap spacing, g, as a result of greater field confinement and better spatial overlap between the dipole emitter and the gap-plasmon modes. This increase in radiation rate corresponds directly to an increase in the radiated power. At gap spacings of a few nm or less, the efficiency can be reduced by non-local and electronic effects that are not considered here. Accordingly, it is preferable that the gap spacing, g, corresponding to the thickness of the light emitting layer, is greater than 3 nanometers.

In some embodiments, a light emitting device is formed on a conventional silicon wafer. An evaporated film of the organic fluorophore Alq3 may be used as the emitter. A pulsed femto-second laser operating at 455 nm optically excited the Alq3 emitters. The emission spectrum of Alq3 extends across the yellow and red portions of the visible spectrum and is therefore sufficiently broad to enable observation of resonances in the emission spectrum (FIG. 6E). Emission from Alq3 molecules is enhanced using embodiments of the present application as compared to a bare film of Alq3 (see FIG. 6A-B). In the case of the 5 nm light emitting layer, the device increased the emission intensity by a factor of 100. This is a large enhancement but is lower than the maximum theoretical prediction. Brighter emission resulted from devices with a thinner gap and smaller lateral dimensions. Furthermore, peaks in the emission spectra are observed at wavelengths that coincide with resonances observed in simulation, and these peaks shift with mesa width exactly as predicted (FIG. 6B).

Figures 7A, 7B:
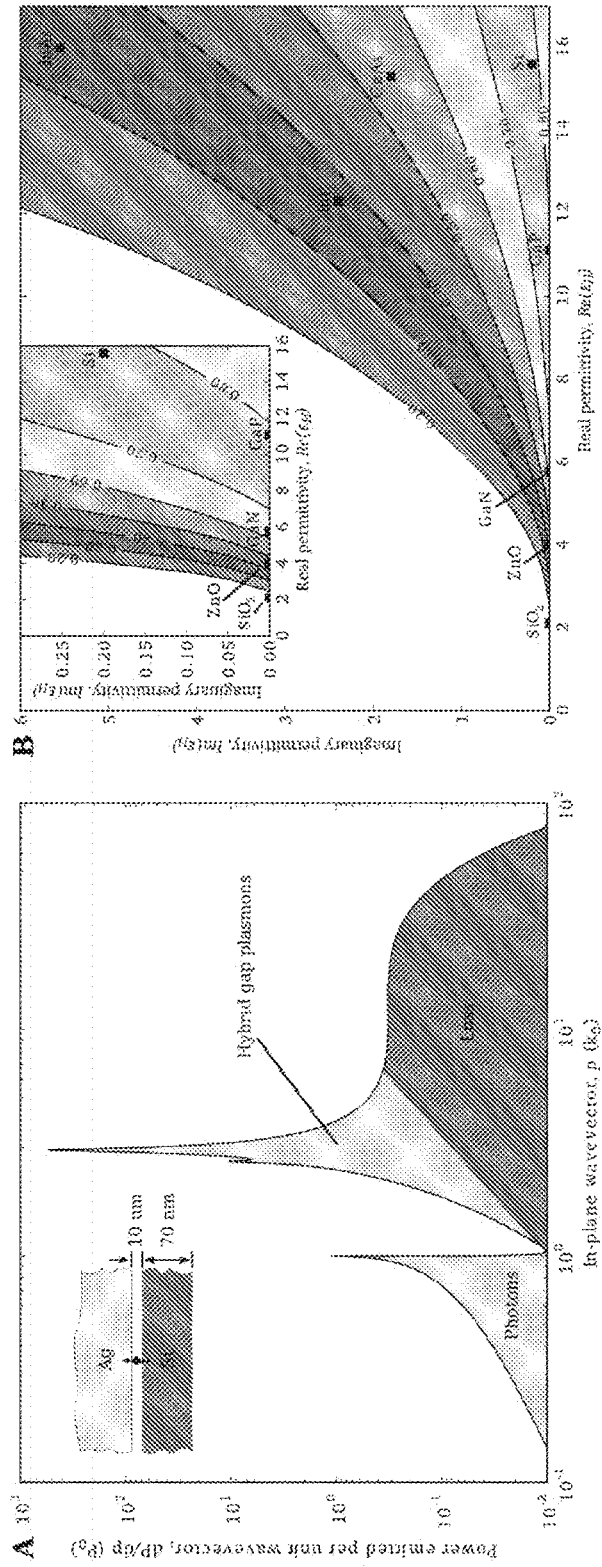
FIG. 7A illustrates the efficiency of radiative plasmon emission according to some embodiments.
FIG. 7B illustrates the relative permittivity for various materials.

FIGS. 7A-B illustrate the use of a one-dimensional analytical model to calculate the efficiency of radiative plasmon emission and analyze the interplay of $Re(\varepsilon_H)$ and $Im(\varepsilon_H)$ in the structure illustrated in FIG. 6F. As this model is only one-dimensional, it represents an approximation of the internal quantum efficiency of plasmon polariton emission that could be expected in this structure. The external quantum efficiency would likely be smaller depending on how efficiently the final device can couple gap plasmon polaritons into the desired output channel (i.e. free-space propagating states or a guided mode in a waveguide). The advantage of the one-dimensional model is that the calculation is fast enough to be performed for a large number of material parameters. By repeating the calculation shown in FIG. 7A for each set of material parameters, it is determined that a substrate with sufficiently large $Re(\varepsilon_H)$ can be absorbing (i.e., $Im(\varepsilon_H)>0$) and still achieve higher overall radiative emission efficiency (exceeding 80%) (FIG. 7B). In particular, silicon may yield one of the highest efficiencies of plasmon emission of conventional dielectric materials. Note that the silicon efficiency is larger than in devices made using conventional non-absorbing materials such as GaN, ZnO, and $SiO_2$.

Light emitting devices according to some embodiments may be formed in any suitable way. In some embodiments, the lateral area of the light emitting device were fabricated with nominal widths ranging in 5 nanometer increments from 50 nm to 250 nm. In some embodiments, devices are fabricated from a silicon wafer using a self-aligned lithography method 800 illustrated in FIG. 8 and FIG. 9.

At act 802, a resist is formed over a portion of a silicon substrate. Any suitable resist may be used. By way of example and not limitation, a negative-tone, electron-beam-sensitive, silicon-containing resist, such as FOX-16 may be used. The resist may be deposited in any suitable way. For example, the resist may be spun on ~1 cm×1 cm pieces of conventional Si wafer. FIG. 9A illustrates the resist 902 on top of silicon substrate 900. Portions of the resist that are not to be removed are then exposed to a high-energy electron beam (100 kV accelerating voltage) to convert the resist into a Si-containing oxide. The unexposed portions of the resist are then removed by immersion in, for example, tetramethylammonium hydroxide. The result is the resist being only over a portion of the silicon substrate. The portion of resist that remains is selected to have a shape and size equal to the desired shape and size of the mesa to be formed.

At act 804, the silicon-containing oxide pattern is transferred to the silicon substrate by reactive ion etching in an inductively-coupled plasma. The etch depth is set based on the desired thickness of the mesa. For example, in the embodiment illustrated in FIG. 9B, the etch depth is ~350 nm. The resulting structure, as illustrated in FIG. 9B is a mesa comprising a layer of silicon and a layer of resist on top of the layer of silicon.

At act 806, photoresist 904 is deposited onto the substrate. For example, the photoresist 904 may be spun onto the sample to a thickness of ~2 micrometers. The thickness of the photoresist 904 is selected to exceed the height of the silicon-plus-resist mesa, which has a combined height of ~900 nm in the example illustrated in FIGS. 9B and 9C. After the photoresist 904 is deposited, it is thinned using, for example, an O2 plasma until ~150 nm of resist extends above the level of the photoresist, as illustrated in FIG. 9C.

At act 808, the remaining resist (e.g., the FOX-16), is removed. This may be achieved in any suitable way. For example, the device illustrated in FIG. 9C may be immersed for ~30 seconds in 7:1 buffered oxide etch. The resulting structure, which includes a blind hole (a cavity with an opening on only one side) in the photoresist, is illustrated in FIG. 9D.

At act 810, a light emitting layer 906 is deposited. Any suitable light emission layer may be used. For example, as discussed above, the light emission layer may be a dielectric layer containing fluorophores, such as Alq3. The Alq3 may be deposited using thermal evaporation at pressures of ~$5 \times 10^{-7}$ Torr.

At act 812, a metallic layer 908 is deposited. Any suitable metal may be used. For example, as discussed above, the metal layer may be a single metal, such as silver, or a metal alloy. The metallic layer may be deposited using thermal evaporation at pressures of ~$5 \times 10^{-7}$ Torr. The resulting structure is illustrated in FIG. 9E. As is illustrated, because a blind hole was formed in the photoresist upon removal of the resist, the blind hole is filled with the light emitting layer and the metallic layer such that a portion of the light emitting layer 906 is in contact with the silicon mesa and the metallic layer is on top of the light emitting layer within the blind hole.

At act 814, a protective coating 910 is formed on top of the metal layer. For example, $Al_2O_3$ may be used. The protective coating 910 may be deposited in any suitable way. For example 100 cycles of atomic layer deposition may be performed at 50° C. to create a protective coating 910 that is ~11 nm thick. The resulting structure is illustrated in FIG. 9F. The protective coating 910 protects the exposed sides of the light emitting layer from exposure to acetone during subsequent steps.

At act 816, the metallic layer that is on the photoresist is removed, without removing the metallic layer that is formed in the blind hole. This may be done in any suitable way. For example, an adhesive material 912, such as standard transparent office tape, may be pressed to the top surface of the sample and retracted, as illustrated in FIG. 9G. Because the top surface of the device structure within the blind hole is below the height of the photoresist, the tape only comes in contact with the protective layer 910 and the metallic layer 908 that are on top of the photoresist 904. The tape 912 does not contact the actual device layers because they are recessed in the blind hole. As the tape 912 is removed, the metallic layer 908 from atop the photoresist 904 is removed. This is because the adhesion of the tape 912 to the protective coating 910 and the adhesion of the protective coating 910 to the metallic layer 908 are both greater than the adhesion of the metallic layer 908 to the light emitting layer 906. All or a portion of the light emitting layer 906 may remain on the photoresist 904, as illustrated in FIG. 9H. However, this is inconsequential, as any remaining light emitting layer 906 is removed in the subsequent step.

At act 818, the photoresist 904 is removed. This may be achieved in any suitable way. For example, the structure illustrated in FIG. 9H may be immersed in acetone for ~30s, leaving completed light emitting devices are encapsulated in ~11 nm the protective coating 910, as illustrated in FIG. 9I.

Figure 8:
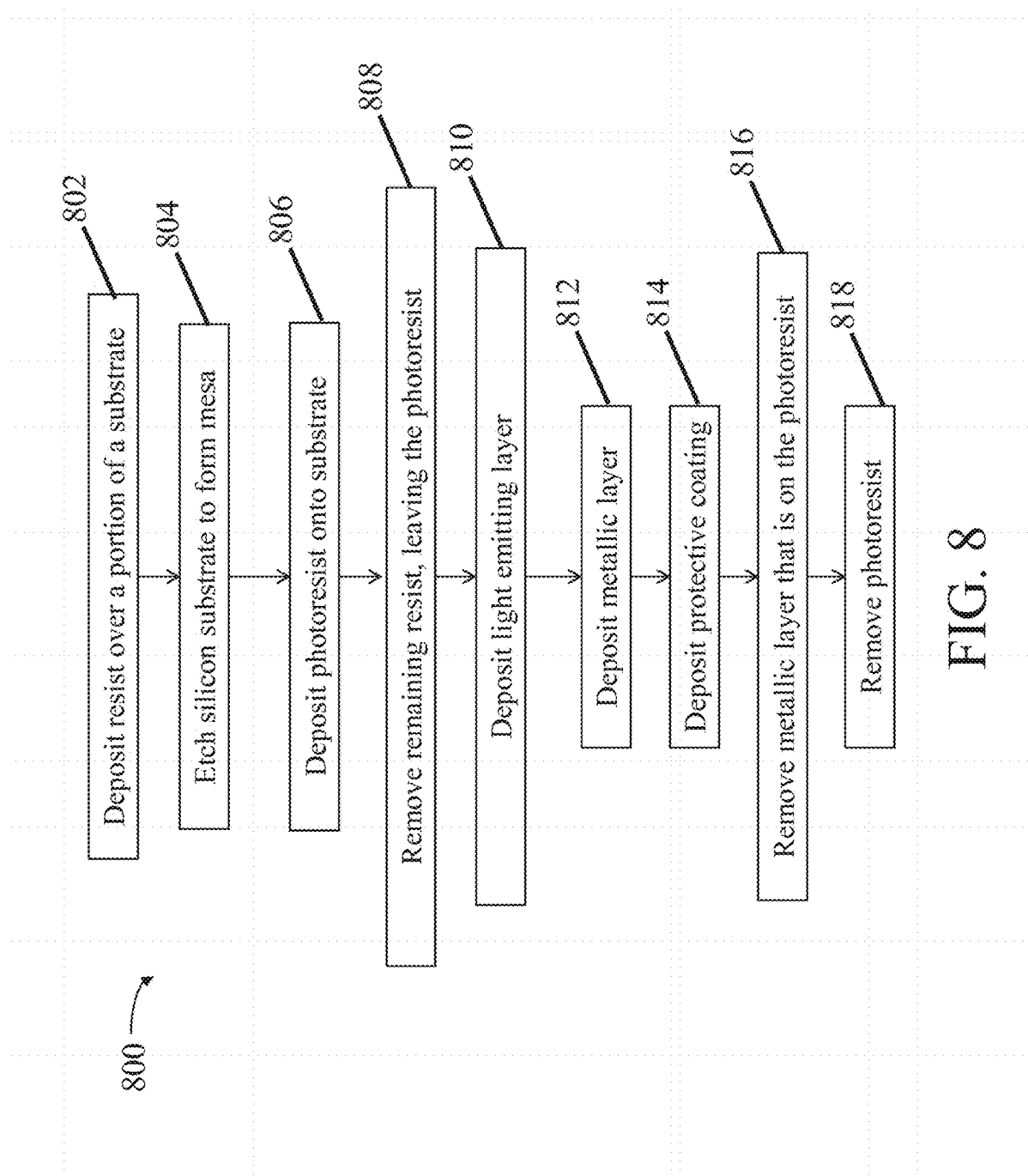
FIG. 8 is a flow chart illustrating a method of fabricating light emitting devices according to some embodiments.
Figure 10:
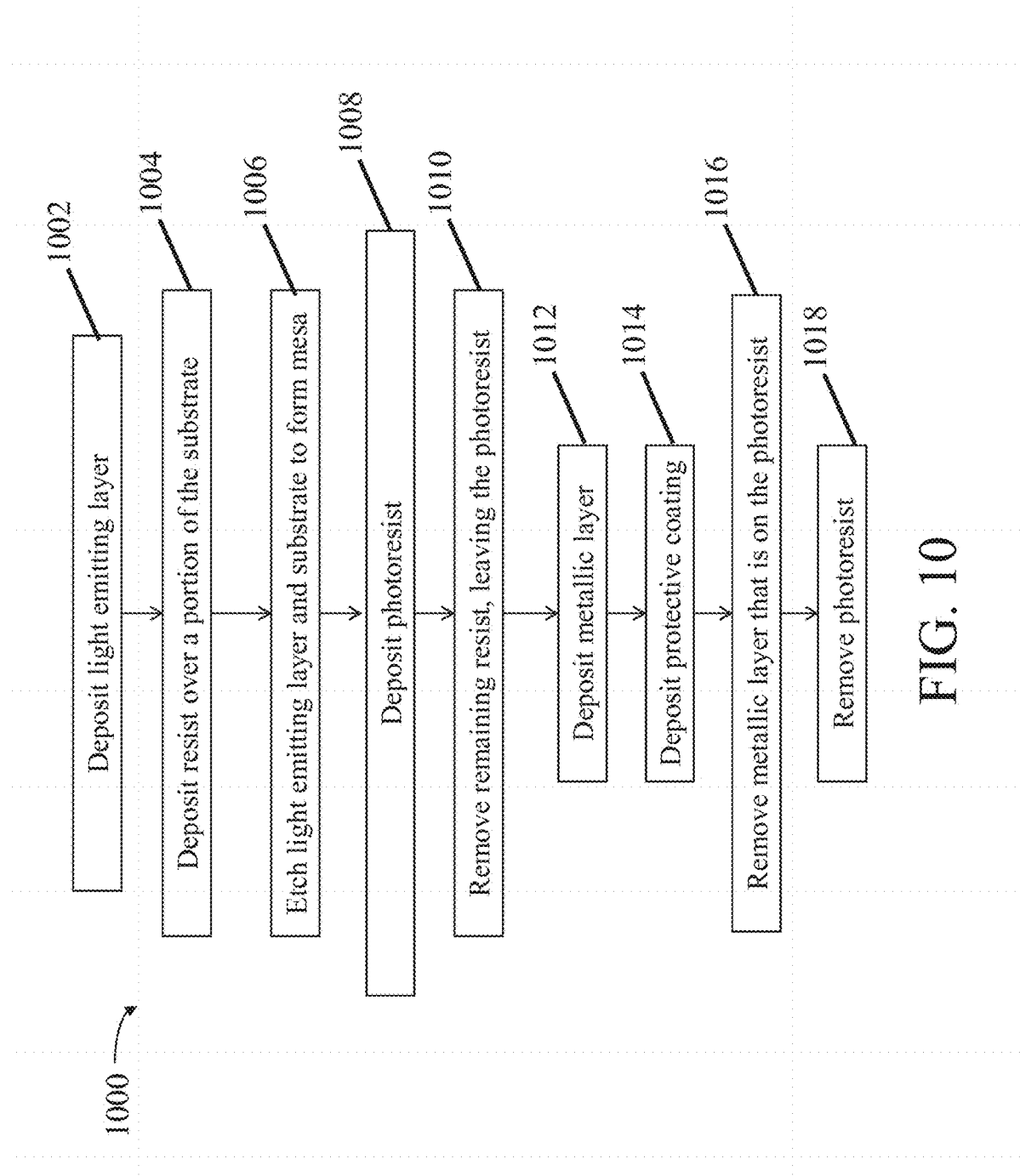
FIG. 10 is a flow chart illustrating a method of fabricating light emitting devices according to some embodiments.

In some embodiments, the method of fabricating a light emitting device may be different from the method described in connection with FIGS. 8-9. For example, an alternative method 1000 of fabricating a light emitting device is illustrated in FIG. 10 where the light emitting layer is deposited before the resist layer.

At act 1002, a light emitting layer is deposited onto at least a portion of a silicon substrate. Any suitable light emission layer may be used. For example, as discussed above, the light emission layer may be a dielectric layer containing fluorophores, such as Alq3. The Alq3 may be deposited using thermal evaporation at pressures of ~5×10-7 Torr.

At act 1004, a resist is formed over a portion of a silicon substrate that corresponds to the mesa that is formed by etching the light emitting layer and substrate at act 1006. At act 1008, a photoresist is deposited onto the substrate. At act 1010, the resist is removed, leaving the photoresist behind.

At act 1012, a metallic layer is deposited. Any suitable metallic material may be used. For example, as discussed above, the metal layer may be a single metal, such as silver, or a metal alloy. The metallic layer may be deposited using thermal evaporation at pressures of ~5×10-7 Torr.

At act 1014, a protective coating is formed on top of the metal layer. For example, Al2O3 may be used. The protective coating may be deposited in any suitable way. For example 100 cycles of atomic layer deposition may be performed at 50° C. to create a protective coating that is ~11 nm thick. The protective coating protects the exposed sides of the light emitting layer from exposure to acetone during subsequent steps.

At act 1016, the metallic layer that is on the photoresist is removed, without removing the metallic layer that is formed in the blind hole. This may be done in any suitable way. For example, an adhesive material, such as standard transparent office tape, may be pressed to the top surface of the sample and retracted. Because the top surface of the device structure within the blind hole is below the height of the photoresist, the tape only comes in contact with the protective layer and the metallic layer that are on top of the photoresist. The tape does not contact the actual device layers because they are recessed in the blind hole. As the tape is removed, the metallic layer from atop the photoresist is removed. This is because the adhesion of the tape to the protective coating and the adhesion of the protective coating to the metallic later are both greater than the adhesion of the metallic layer to the light emitting layer 906. All or a portion of the light emitting layer may remain on the photoresist. However, this is inconsequential, as any remaining light emitting layer is removed in the subsequent step.

At act 1018, the photoresist is removed. This may be achieved in any suitable way. For example, the structure may be immersed in acetone for ~30 s, leaving completed light emitting devices are encapsulated in ~11 nm the protective coating.

Embodiments described in the present application provide the ability to utilize silicon as a high-efficiency platform for visible light generation offers many interesting possibilities for future applications, including on-chip optical data transmission between processing cores and integrated display chips incorporating visible light detection and logic. However, embodiments are not limited to applications in any particular field.

Having thus described several aspects of at least one embodiment, it is to be appreciated that various alterations, modifications, and improvements will readily occur to those skilled in the art. For example, the spherical metallic structure of FIG. 1D may be formed on top of a mesa instead of the metallic layer illustrated in FIG. 1B. Alternatively, any other shape metallic structure may be used.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Use of ordinal term "approximately" indicates the value should be within 10% of the referenced value. For example, a thickness of "approximately 50 nm" means a thickness that is between 45 nm and 55 nm.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A light emitting device comprising:
   a semiconductor layer;
   a metallic structure; and
   a light emission layer disposed between the semiconductor layer and the metallic structure, wherein the light emission layer is in physical contact with the metallic structure and the semiconductor layer, wherein the light emission layer comprises at least one fluorescent molecule that emits light of at least a first frequency upon excitation by an excitation signal.

2. The light emitting device of claim 1, wherein the semiconductor layer comprises a semiconductor material with a relative permittivity greater than or equal to 10 at the first frequency.

3. The light emitting device of claim 2, wherein the semiconductor material comprises silicon.

4. The light emitting device of claim 1, wherein the metallic structure is a metallic layer that completely covers one surface of the light emission layer.

5. The light emitting device of claim 4, wherein a thickness of the light emission layer is less than a thickness of the metallic layer.

6. The light emitting device of claim 5, wherein the thickness of the light emission layer is at least an order of magnitude smaller than the thickness of the metallic layer.

7. The light emitting device of claim 1, wherein the metallic structure is a metallic sphere that is in contact with the light emission layer at a single location.

8. The light emitting device of claim 1, wherein the semiconductor layer comprises a semiconductor substrate.

9. The light emitting device of claim 1, wherein the semiconductor layer comprises a semiconductor mesa that extends from a semiconductor substrate.

10. The light emitting device of claim 9, wherein a width of the semiconductor mesa is equal to a width of the metallic structure.

11. The light emitting device of claim 10, wherein the width of the semiconductor mesa is less than 200 nm.

12. The light emitting device of claim 11, wherein the width of the semiconductor mesa is approximately 50 nm.

* * * * *